(12) United States Patent
Wuister et al.

(10) Patent No.: US 8,691,124 B2
(45) Date of Patent: Apr. 8, 2014

(54) ALIGNMENT AND IMPRINT LITHOGRAPHY

(75) Inventors: Sander Frederik Wuister, Eindhoven (NL); Yvonne Wendela Kruijt-Stegeman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 20 days.

(21) Appl. No.: 13/510,581

(22) PCT Filed: Sep. 30, 2010

(86) PCT No.: PCT/EP2010/064607
§ 371 (c)(1),
(2), (4) Date: May 17, 2012

(87) PCT Pub. No.: WO2011/064020
PCT Pub. Date: Jun. 3, 2011

(65) Prior Publication Data
US 2012/0225152 A1  Sep. 6, 2012

Related U.S. Application Data

(60) Provisional application No. 61/264,108, filed on Nov. 24, 2009.

(51) Int. Cl.
*B29C 59/02*  (2006.01)
*B29C 59/16*  (2006.01)

(52) U.S. Cl.
USPC ......... 264/40.5; 264/40.1; 264/299; 264/293; 264/406; 264/408; 425/150; 425/169; 425/171; 425/174.4; 425/375; 425/385

(58) Field of Classification Search
USPC .............. 425/174.4, 375, 385, 150, 169, 171; 264/299, 293, 40.1, 40.5, 406, 408
See application file for complete search history.

(56) References Cited

U.S. PATENT DOCUMENTS

| 4,731,255 A | 3/1988 | Maeda et al. |
| 5,772,905 A | 6/1998 | Chou |
| 6,334,960 B1 | 1/2002 | Willson et al. |
| 2004/0134566 A1 | 7/2004 | Iyoda et al. |
| 2005/0274693 A1 | 12/2005 | Heidari et al. |
| 2006/0114450 A1 | 6/2006 | Nimmakayala et al. |

(Continued)

FOREIGN PATENT DOCUMENTS

| CN | 1455888 | 11/2003 |
| WO | 02/067055 | 8/2002 |
| WO | 2004/013693 | 2/2004 |

OTHER PUBLICATIONS

International Search Report mailed Dec. 20, 2010 in corresponding International Patent Application No. PCT/EP2010/064607.

(Continued)

*Primary Examiner* — Joseph S Del Sole
*Assistant Examiner* — Lawrence D Hohenbrink, Jr.
(74) *Attorney, Agent, or Firm* — Pillsbury Winthrop Shaw Pittman LLP

(57) ABSTRACT

An imprint lithography alignment apparatus is disclosed that includes at least two detectors which are configured to detect an imprint template alignment mark, wherein the alignment apparatus further comprises alignment radiation adjustment optics which are configured to provide adjustment of locations from which the at least two alignment detectors receive alignment radiation.

20 Claims, 8 Drawing Sheets

(56) References Cited

U.S. PATENT DOCUMENTS

| | | | |
|---|---|---|---|
| 2006/0126058 A1 | 6/2006 | Nimmakayala et al. | |
| 2006/0279004 A1* | 12/2006 | Suehira et al. | 257/797 |
| 2007/0231421 A1 | 10/2007 | Nimmakayala et al. | |
| 2007/0242272 A1 | 10/2007 | Suehira et al. | |
| 2007/0266875 A1* | 11/2007 | Berge | 101/481 |
| 2008/0020303 A1 | 1/2008 | Wu et al. | |

OTHER PUBLICATIONS

Jan Haisma et al., "Mold-assisted nanolithography: A process for reliable pattern replication," J. Vac. Sci. Technol., vol. B14, No. 6, pp. 4124-4128 (Nov./Dec. 1996).

Taiwan Office Action dated Jul. 29, 2013 in corresponding Taiwan Patent Application No. 099135088.

* cited by examiner

-- PRIOR ART --

-- PRIOR ART --

-- PRIOR ART --

-- PRIOR ART --

ALIGNMENT AND IMPRINT LITHOGRAPHY

This application is the United States national phase entry of PCT patent application no. PCT/EP2010/064607, filed Sep. 30, 2010, which claims the benefit of U.S. provisional patent application No. 61/264,108, which was filed on Nov. 24, 2009, the contents of both of which are incorporated herein in their entireties by reference.

FIELD

The present invention relates to an alignment apparatus and method and to imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g., nanometer sized feature or sub micron sized features) that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve bringing together a patterned surface of an imprint template and a layer of imprintable liquid medium (e.g., moving the imprint template toward the imprintable medium, or moving the imprintable medium toward the imprint template, or both) such that the imprintable medium flows into recesses in the patterned surface and is pushed aside by protrusions on the patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

It may be desirable to align an imprint template and a substrate, such that the imprint template imprints a pattern at a desired location on the substrate. For example, it may be desired to align the imprint template with a pattern already provided on the substrate. An alignment apparatus which directs alignment radiation at alignment marks provided on the imprint template and the substrate may be used to align the imprint template and the substrate.

SUMMARY

It is desirable, for example, to provide an alignment apparatus which allows alignment to be achieved for imprint templates having alignment marks in different positions.

According to an aspect, there is provided an imprint lithography alignment apparatus comprising:

at least two detectors which are configured to detect an imprint template alignment mark; and alignment radiation adjustment optics configured to provide adjustment of locations from which the at least two alignment detectors receive alignment radiation.

According to an aspect, there is provided a method of measuring alignment of an imprint template with respect to a substrate, the method comprising:

adjusting locations at which detectors receive alignment radiation from an imprint template, such that the alignment radiation beams are received from alignment marks on the imprint template;

detecting alignment radiation from the alignment marks on the imprint template and alignment marks on the substrate; and using the detected alignment radiation to determine a misalignment between the imprint template and the substrate.

BRIEF DESCRIPTION OF THE DRAWINGS

Specific embodiments of the invention will be described with reference to the accompanying figures, in which.

DETAILED DESCRIPTION

Figure 1A:
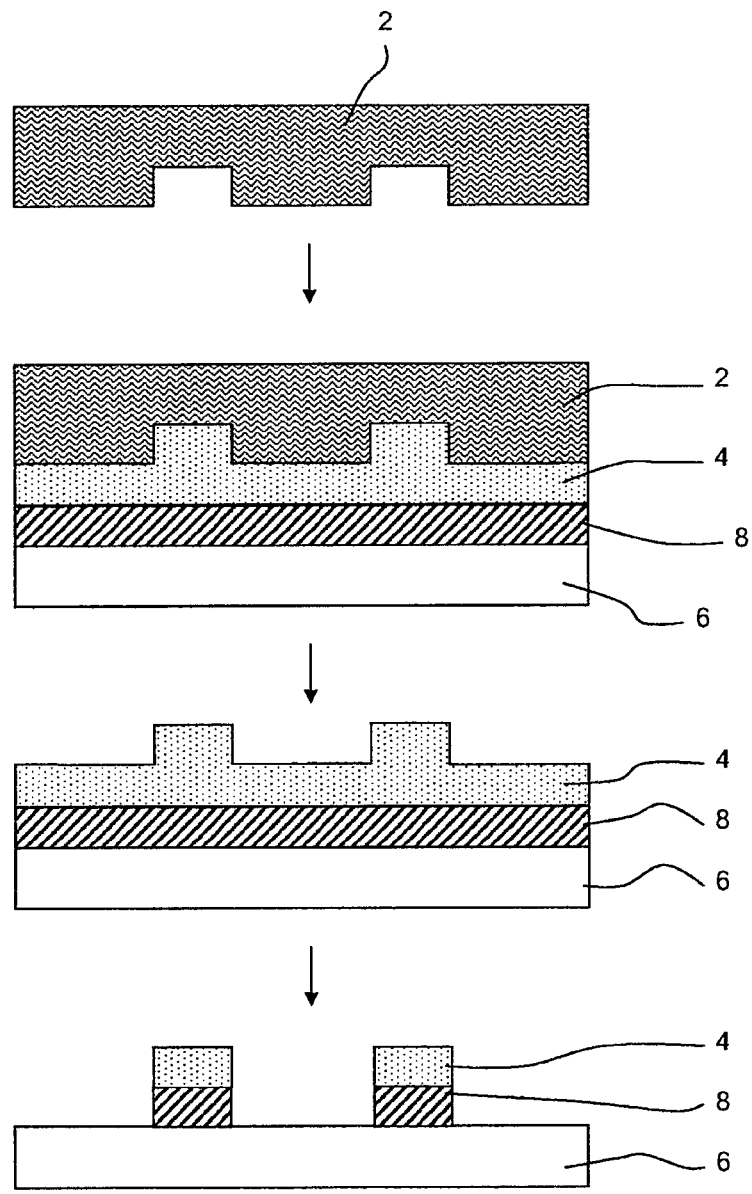
FIGS. 1a and 1b schematically depict examples of, respectively, hot imprint, and UV imprint lithography.
Figure 1B:
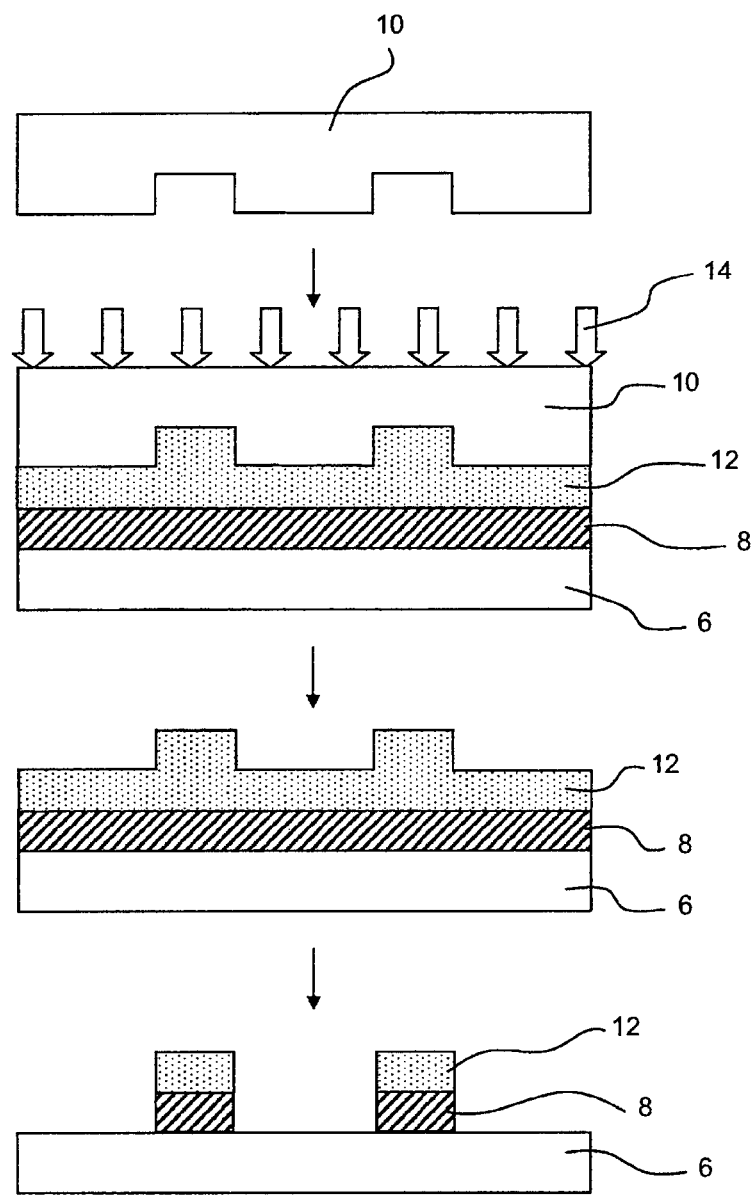

Examples of approaches to imprint lithography are schematically depicted in FIGS. 1a to 1b.

FIG. 1 a shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may for example be resin. The resin may for instance be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template comes into contact with the flowable resin and then cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,255 and U.S. Pat. No. 5,772,905.

FIG. 1*b* shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). UV curable liquids are often less viscous than the thermosetting and thermoplastic resins used in hot imprint lithography and consequently may move much faster to fill template pattern features. A quartz template 10 is applied to a UV-curable resin 12 in a similar manner to the process of FIG. 1*a*. However, instead of using heat or temperature cycling as in hot imprint, the pattern is solidified by curing the imprintable medium 12 with UV radiation 14 that is applied through the quartz template 10 onto the imprintable medium 12. After removal of the template 10, the imprintable medium 12 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0134566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B24(6), Nov/Dec 1996.

Combinations of the above imprint techniques are also possible. See, e.g., U.S. Patent Application Publication No. 2005-0274693, which mentions a combination of heating and UV curing an imprintable medium.

It may be desirable to form patterns of different sizes on different substrates. For example, it may be desirable to form patterns on a substrate which are dimensioned such that they may be overlaid with patterns projected by an optical lithography apparatus. The maximum size of optical field which may be projected by a conventional optical lithographic apparatus is 33 mm×26 mm. It may therefore be desirable to use an imprint template having a patterned region which measures 33 mm×26 mm. However, it is often desirable to use an imprint template having a smaller patterned region (for example to form a layer of a smaller integrated circuit). The size of the patterned region of the imprint template for a given imprint lithography process may be selected based upon the size of an integrated circuit (or other product) which is to be formed by the lithography process. Taking as an example an integrated circuit which measures 5 mm×3 mm, an imprint template may comprise 5 rows and 11 columns of a pattern which forms a layer of the integrated circuit (thereby having a patterned region which measures 25 mm×33 mm). In an alternative example, an integrated circuit may measure 9 mm×15 mm, and an imprint template may comprise 2 rows and 2 columns of a pattern which forms a layer of the integrated circuit (thereby having a patterned region which measures 18 mm×30 mm).

Figure 2A:
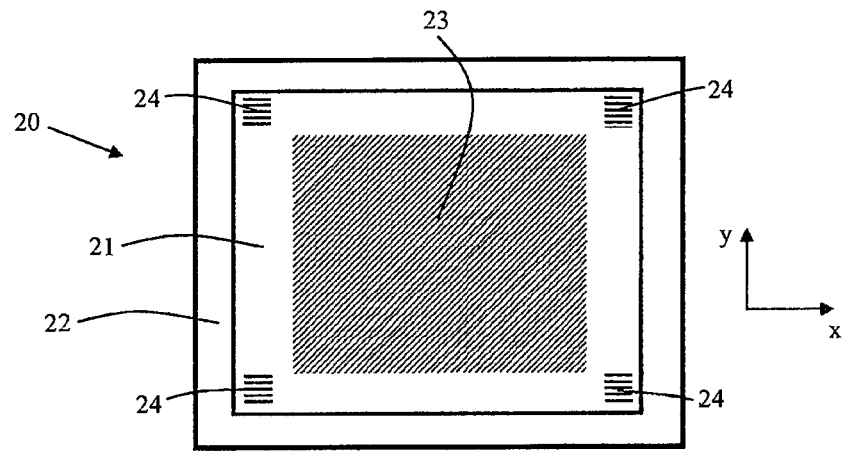
FIGS. 2a and 2b schematically depict imprint templates which may be used in connection with an embodiment of the invention.

Typically, alignment marks are provided in corners of an imprint template (although they may be provided in other locations). Examples of two imprint templates are shown schematically, viewed from beneath, in FIG. 2. The imprint template 20 shown in FIG. 2*a* comprises a patterned region 21 and an unpatterned region 22 which surrounds the patterned region. The patterned region 21 protrudes from the unpatterned region 22, and is sometimes referred to as a mesa. The patterned region 21 comprises a device pattern 23 and alignment marks 24. An alignment mark 24 is provided in each corner of the patterned region 21. The imprint template 20 of FIG. 2*a* is referred to hereafter as the large imprint template 20.

Figure 2B:
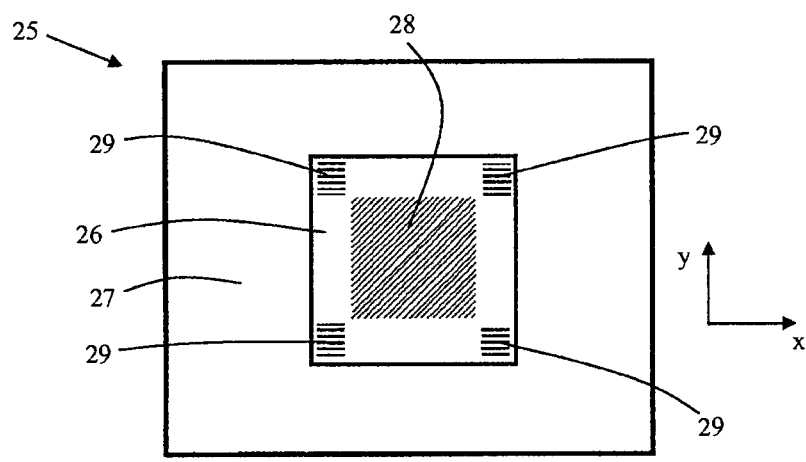

An imprint template 25 is shown in FIG. 2*b*. The imprint template 25 of FIG. 2*b* has the same general configuration as the imprint template 20 of FIG. 2*a*, and comprises a patterned region 26 and an unpatterned region 27. The patterned region 26 comprises a device pattern 28 and alignment marks 29. The patterned region 26 is considerably smaller than the patterned region 21 of the large imprint template 20. The imprint template of FIG. 2*b* is referred to hereafter as the small imprint template 25.

The external perimeters of the small imprint template 25 and the large imprint template 20 may be the same. This may allow the small imprint template 25 and the large imprint template 20 to be held by the same imprint template holder in an imprint lithography apparatus.

The distance between alignment marks 29 of the small imprint template 25 is significantly smaller than the distance between the alignment marks 24 of the large imprint template 20. During operation of an imprint lithography apparatus, an alignment radiation beam may be oriented such that it is incident upon an alignment mark 24 of the large imprint template 20. However, if the large imprint template 20 is replaced with the small imprint template 25, then the alignment radiation beam will not be incident upon an alignment mark 29 of the small imprint template 25 (the alignment mark of the small imprint template will have a different position within the imprint lithography apparatus).

It can be seen from FIGS. 2*a* and 2*b* that there may be significant variation of the positions of the imprint template alignment marks 24, 29. Corresponding variation will also be seen in the positions of associated substrate alignment marks.

Embodiments of the invention provide an alignment apparatus which is configured to simultaneously measure the positions of a plurality of alignment marks, the alignment apparatus including an adjustment mechanism which allows alignment radiation beams to be directed at imprint template alignment marks at different positions.

Figure 3A:
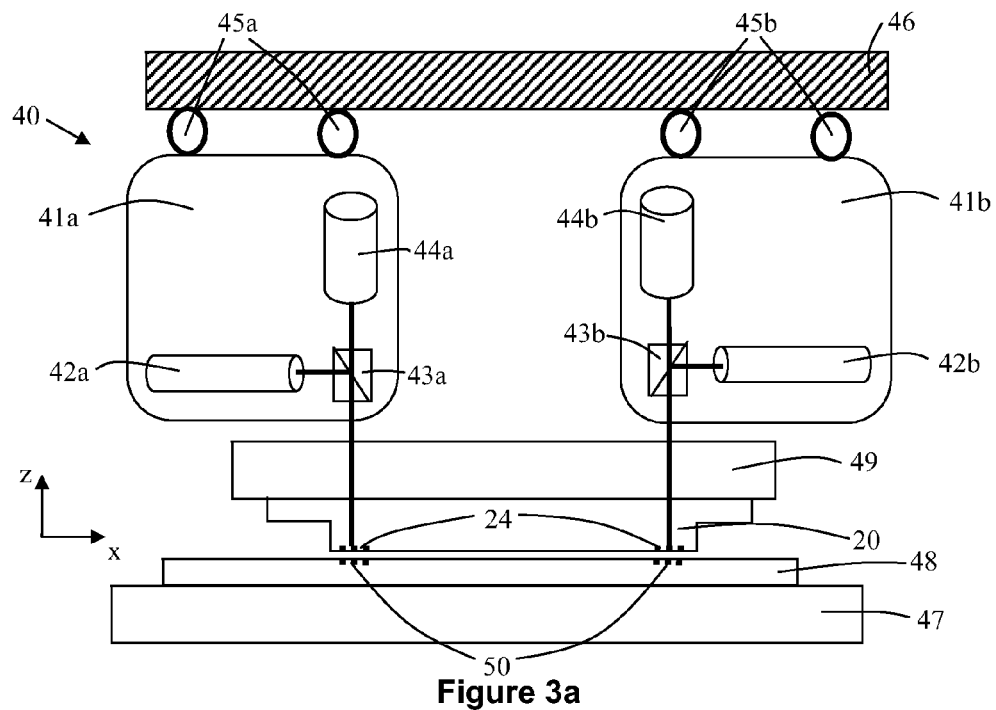
FIGS. 3a and 3b schematically depict an imprint lithography apparatus according to an embodiment of the invention.
Figure 3B:
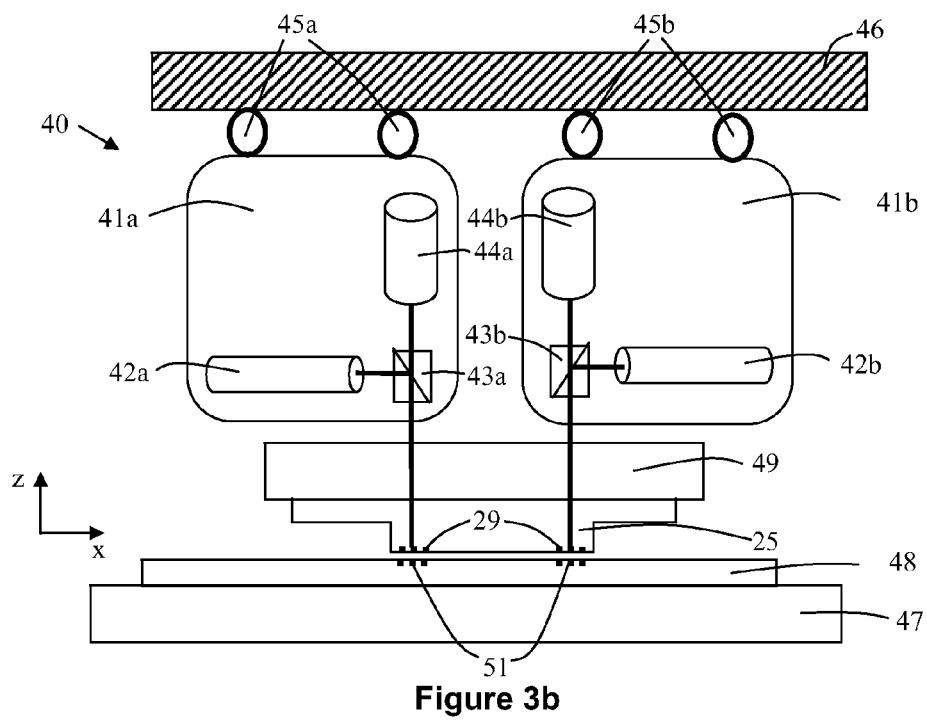

FIGS. 3*a* and 3*b* show schematically viewed from one side an imprint lithography apparatus according to an embodiment of the invention. The imprint lithography apparatus comprises an alignment apparatus 40 which comprises a first alignment module 41*a* and a second alignment module 41*b*. Each alignment module 41*a*, *b* comprises an alignment radiation source 42*a*, *b*, a beam splitter 43*a*, *b*, and a detector 44*a*, *b*. Each alignment module 41*a*, *b* is connected to an actuator 45*a*, *b* which may be used to move the respective alignment module. The actuators 45*a*, *b* are connected to a structure 46 which forms part of the lithography apparatus. The structure 46 may for example form part of a frame, which may be a metrology frame of the lithography apparatus (e.g. a frame which is substantially isolated from vibrations). The imprint lithography apparatus further comprises a substrate table 47 which is configured to support a substrate 48, and an imprint template holder 49 which is configured to hold an imprint template 20.

In use, the actuators 45*a*, *b* are used to move the alignment modules 41*a*, *b* until the beam splitters 43*a*, *b* are located above alignment marks 24 which are provided on the imprint template 20. The substrate table 47 is used to position the substrate 48 such that it is coarsely aligned with the imprint template 20. The alignment radiation sources 42*a*, *b* then generate alignment radiation beams which are directed by the beam splitters 43*a*, *b* onto the imprint template alignment marks 24 and onto substrate alignment marks 50. Alignment radiation is diffracted by the imprint template alignment marks 24 and substrate alignment marks 50, and passes back through the beam splitters 43*a*, *b* to the detectors 44*a*, *b*. Properties of the alignment radiation which are detected by the detectors 44*a*, *b* are used to determine a misalignment between the imprint template 20 and the substrate 48.

The substrate table 47 is moved in order to eliminate or reduce the misalignment, thereby aligning the imprint template 20 with the substrate 48. Alternatively or additionally, the imprint template holder 49 may be moved. In some instances, the shape of the imprint template 20 may be adjusted by the imprint template holder 49 in order to match the shape of the imprint template to the shape of a pattern already present on the substrate 48. An actuator (not shown) is then used to press the imprint template 20 against imprintable medium (not shown) provided on the substrate 48. The alignment apparatus 40 may continue to monitor the alignment between the imprint template 20 and the substrate 48 while the imprint template is contacting the imprintable medium provided on the substrate (e.g., being pressed against the substrate). A period of time may be allowed to elapse in order to allow imprintable medium to flow into recesses of the patterned region of the imprint template. Following this, the imprintable medium may be illuminated with actinic radiation generated by an actinic radiation source (not shown), thereby causing the imprintable medium to cure and thus solidify. The imprint template 20 may then be removed from the substrate 48.

The above method of alignment and imprint may also be used in connection with other embodiments of the invention which are described further below.

The imprint template shown in FIG. 3*a* corresponds to the large imprint template 20 described further above in relation to FIG. 2*a*. This imprint template has a relatively large patterned region 21, and has alignment marks 24 which are separated by a considerable distance. As mentioned above, the actuators 45*a*, *b* are used to position the alignment modules 41*a*, *b* so that the beam splitters 43*a*, *b* are above the imprint template alignment marks 24, and the alignment radiation beams are thus incident upon the imprint template alignment marks.

The same alignment apparatus 40 is shown in FIG. 3*b*. However, in this instance the smaller imprint template 25 is present in the lithographic apparatus. Alignment marks 29 of the smaller imprint template 25 are separated by a significantly smaller distance than the alignment marks 24 of the larger imprint template 20. The actuators 45*a*, *b* are used to move the alignment modules 41*a*, *b* closer together, such that the beam splitters 43*a*, *b* are located above the alignment marks 29 of the imprint template 25. The alignment radiation beams are thus incident upon the imprint template alignment marks 29. Alignment of the substrate 48 and the imprint template 25 may thus be achieved.

The actuators 45*a*, *b* allow the alignment modules 41*a*, *b* to be moved so that the alignment radiation beams are directed onto imprint template alignment marks irrespective of the positions of the imprint template alignment marks. Although only movement of the alignment modules 41*a*, *b* in the x-direction is shown in FIG. 3, the alignment modules may also be moved in the y-direction. The actuators 45*a*, *b* allow lateral displacement of the alignment radiation beams to be achieved. The term 'lateral displacement' may be interpreted as meaning movement of the radiation beam in a direction which is substantially transverse to the direction of propagation of the radiation beam (e.g. the direction of propagation of the radiation beam when it is incident upon the imprint template 24).

The direction of movement of the alignment modules 41*a*, *b* may be substantially transverse to the direction of propagation of the alignment radiation beams, thereby providing lateral displacement of the alignment radiation beams. Alternatively or additionally, the direction of movement of the alignment modules 41*a*, *b* may include a component which is not substantially transverse to the direction of propagation of the alignment beams (this may still provide lateral displacement of the alignment radiation beams).

The actuators 45*a*, *b* may for example comprise a linear actuator, a piezo-electric actuator, an electromechanical actuator, a pneumatic actuator, or an electromagnetic actuator (e.g. a coil of the type which is found in acoustic speakers).

Figure 4A:
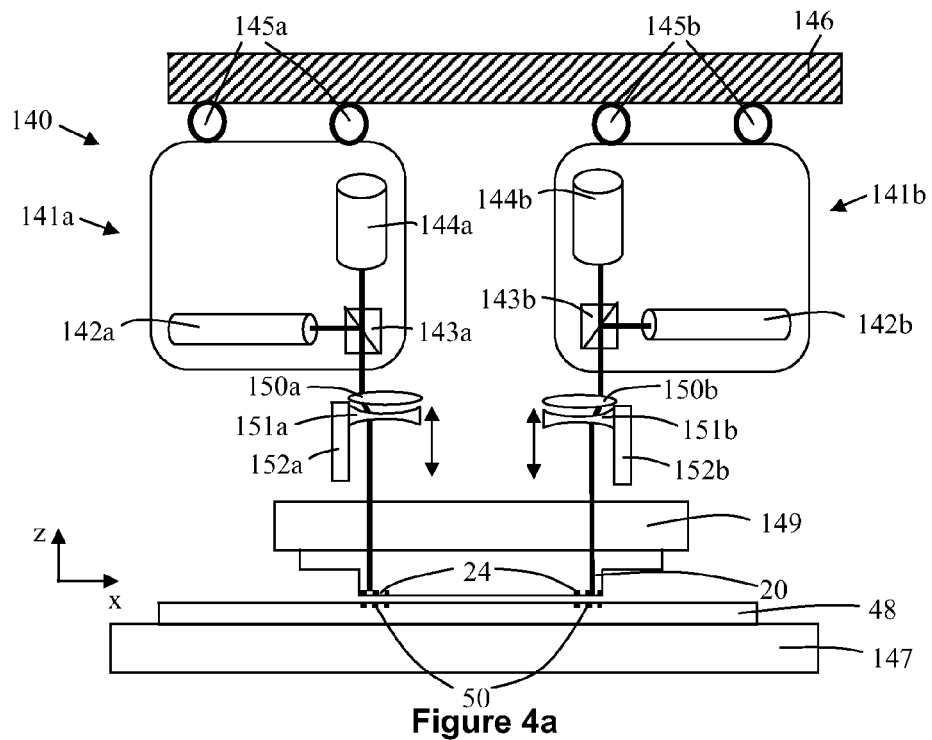
FIGS. 4a and 4b schematically depict the imprint lithography apparatus of FIG. 3 with an additional adjustment mechanism.
Figure 4B:
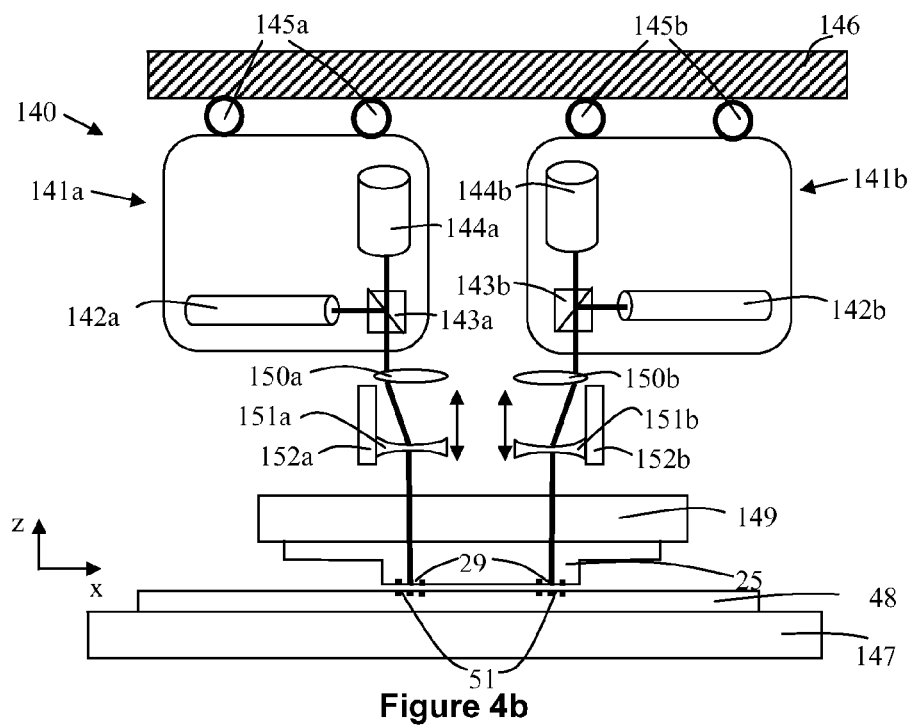

FIGS. 4*a* and 4*b* show schematically viewed from one side an imprint lithography apparatus which corresponds to that shown in FIG. 3, but which includes an additional adjustment mechanism. The imprint lithography apparatus comprises an alignment apparatus 140 which comprises a first alignment module 141*a* and a second alignment module 141*b*. Each alignment module 141*a*, *b* comprises an alignment radiation source 142*a*, *b*, a beam splitter 143*a*, *b*, and a detector 144*a*, *b*. Each alignment module 141*a*, *b* is connected to an actuator 145*a*, *b* which may be used to move the alignment module. The actuators 145*a*, *b* are connected to a structure 146 which forms part of the lithography apparatus. The imprint lithography apparatus further comprises a substrate table 147 which is configured to support a substrate 48, and an imprint template holder 149 which is configured to hold an imprint template 20, 25.

Each alignment module 141*a*, *b* further comprises a convex lens 150*a*, *b* and a concave lens 151*a*, *b*. Each convex lens 150*a*, *b* is located beneath a beam splitter 143*a*, *b*. Each concave lens 151*a*, *b* is connected to an actuator 152*a*, *b* and is located beneath a convex lens 150*a*, *b*. Each concave lens 151*a*, *b* is movable in the z-direction using the actuator 152*a*, *b* (indicated by double headed arrows in FIG. 4). Additionally or alternatively, each convex lens 150*a*, *b* is connected to an actuator (not shown) and is movable in the z-direction using the actuator for that lens.

The lenses 150*a*, *b*, 151*a*, *b* may be used to provide additional lateral displacement of the alignment radiation beam. The lateral displacement provided by the lenses 150*a*, *b*, 151*a*, *b* depends upon the separation between the lenses. Referring to FIG. 4*a*, when the concave lens 151*a*, *b* is close to the convex lens 150*a*, *b*, the lateral displacement of the alignment radiation beam which is provided by the lenses is small.

The positions of the concave lenses 151*a*, *b* (and/or convex lenses 150*a*, *b*) are selected in combination with the positions of the alignment module actuators 145*a*, *b* in order to direct the alignment radiation beams onto alignment marks 24 of the substrate 20.

In FIG. 4*b*, the concave lenses 151*a*, *b* are a considerable distance from the convex lenses 150*a*, *b*, and the lenses thus provide considerable lateral displacement of the alignment radiation beams. It can be seen from FIG. 4*b* that the actuators 145*a*, *b* have been used to move the alignment modules 141*a*, *b* closer together (compared with FIG. 4*a*). The movement of the alignment modules 141*a*, *b*, together with the separation of the convex lenses 151*a*, *b* from the concave lenses 150*a*, *b*, is used to ensure that the alignment radiation beams are incident upon alignment marks 29 of the imprint template 25 which is present in the lithographic apparatus.

The lenses 150*a*, *b*, 151*a*, *b* may allow the alignment radiation beam to be incident upon imprint template alignment marks which it might otherwise not be possible to reach with the alignment radiation beams. For example, the range of movement of the alignment modules 141*a*, *b* may be limited by the space which is occupied by the alignment modules. The lenses 150*a*, *b*, 151*a*, *b* may allow the alignment radiation beams to be brought closer together than would be possible if the lenses were not present.

The lenses 150*a*, *b*, 151*a*, *b* may be used to provide fine adjustment of the positions at which alignment radiation beams are incident upon alignment marks of the imprint template. In combination with this, the movement of the alignment modules 141*a*, *b* may be used to provide coarse adjustment of the positions at which alignment radiation beams are incident upon alignment marks of the imprint template.

The convex lenses 150*a*, *b*, concave lenses 151*a*, *b* and actuators 152*a*, *b* may together be considered to comprise alignment radiation beam adjustment optics. The alignment radiation beam adjustment optics may comprise any suitable combination of one or more of the following: lenses, mirrors, prisms, beam-splitters, dichroic mirrors, pinholes, gratings, polarizers, or quarter-wave plates.

The alignment radiation beam adjustment optics may comprise other adjustment mechanisms.

In an embodiment, the alignment radiation beam adjustment optics may be provided without the actuators 145*a*, *b* being present, such that lateral displacement of the alignment radiation beam is provided only by the alignment radiation beam adjustment optics (e.g. without movement of the alignment modules 141*a*, *b*).

In an embodiment, the alignment modules 141*a*, *b* may comprise optics which are common to both of them. For example, a single convex lens and a single concave lens may be provided, the lenses being sufficiently large that they receive both alignment radiation beams.

Figure 5:
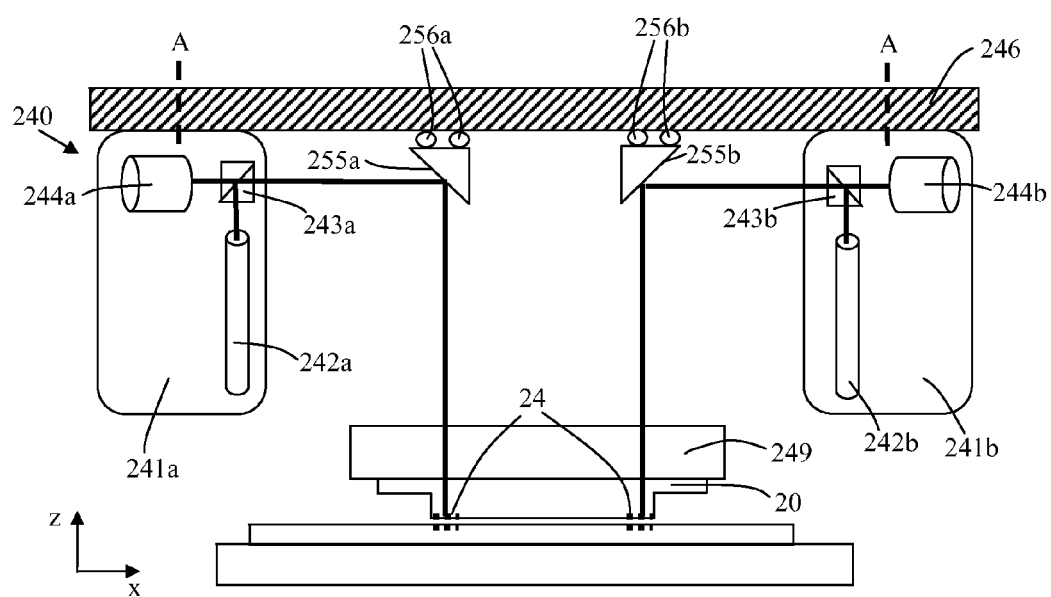
FIG. 5 schematically depicts an imprint lithography apparatus according to a further embodiment of the invention.

FIG. 5 shows schematically viewed from one side an imprint lithography apparatus according to a further embodiment. Referring to FIG. 5, an alignment apparatus 240 comprises a first alignment module 241*a* and a second alignment module 241*b*. Each alignment module comprises an alignment radiation source 242*a*, *b*, a beam splitter 243*a*, *b* and a detector 244*a*, *b*. The alignment modules 241*a*, *b* are not connected to a structure 246 of the lithography apparatus via actuators. Instead, the alignment modules 241*a*, *b* are rotatably attached to the structure 246 (e.g. with an axis A of rotation which is perpendicular to the patterned surface of the imprint template 20). Mirrors 255*a*, *b* are connected to the structure 246 via actuators 256*a*, *b* (referred to hereafter as "mirror actuators"). In this example the mirrors 255*a*, *b* are oriented at 45° relative to a patterned surface of an imprint template 20 which is held by an imprint template holder 249 of the lithography apparatus. The mirror actuators 256*a*, *b* may be used to move the mirrors 255*a*, *b* towards and away from the alignment modules 241*a*, *b*. The mirrors 255*a*, *b* and mirror actuators 256*a*, *b* thus provide lateral displacement of the alignment radiation beams. In this way, the mirrors 255*a*, *b* and mirror actuators 256*a*, *b* may be used to adjust the alignment apparatus 240 such that the alignment radiation beams are always incident upon imprint template alignment marks 24.

In addition or alternatively to moving towards and away from the alignment modules 241*a*, *b* (the x-direction in FIG. 5), the mirror actuators 256*a*, *b* may configured to move the mirrors 255*a*, *b* in a transverse direction (the y-direction in FIG. 5). The mirrors 255*a*, *b* may also be rotatable about axes which are parallel and/or perpendicular to the z-axis. The alignment modules 241*a*, *b* are rotatably mounted on the structure 246, and may rotate about axes A. Rotation of the alignment modules 241*a*, *b* about the axes A allows the alignment radiation beams to track movement of the mirrors 255*a*, *b* in the transverse direction. Thus, the alignment radiation beam may be displaced laterally in order to take account of the position of the imprint template alignment marks 24 in both the x and y-directions.

The rotation of the alignment modules 241*a*, *b* about the axes A may ensure that alignment radiation has a substantially perpendicular angle of incidence upon detecting surfaces of the detectors 244*a*, *b*. The rotation of the alignment modules 241*a*, *b* may ensure that the alignment radiation has a substantially perpendicular angle of incidence upon the imprint template alignment marks 24.

A second set of moveable mirrors may be used to steer the alignment radiation towards the detectors 244*a*, *b*.

The mirror actuators 256*a*, *b* may for example comprise a linear actuator, a piezo-electric actuator, an electromechanical actuator, a pneumatic actuator, or an electromagnetic actuator (e.g. a coil of the type which is found in acoustic speakers).

Although the mirrors 255*a*, *b* are oriented at 45° relative to a patterned surface of the imprint template 20, the mirrors may be oriented at other angles.

Figure 6A:
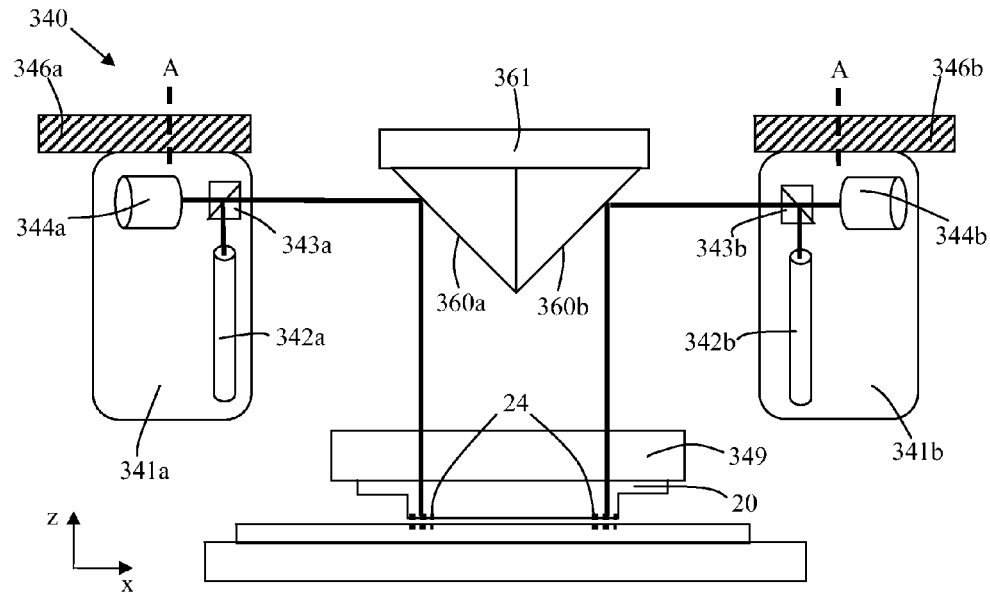
FIGS. 6a and 6b schematically depict an imprint lithography apparatus according to a further embodiment of the invention.
Figure 6B:
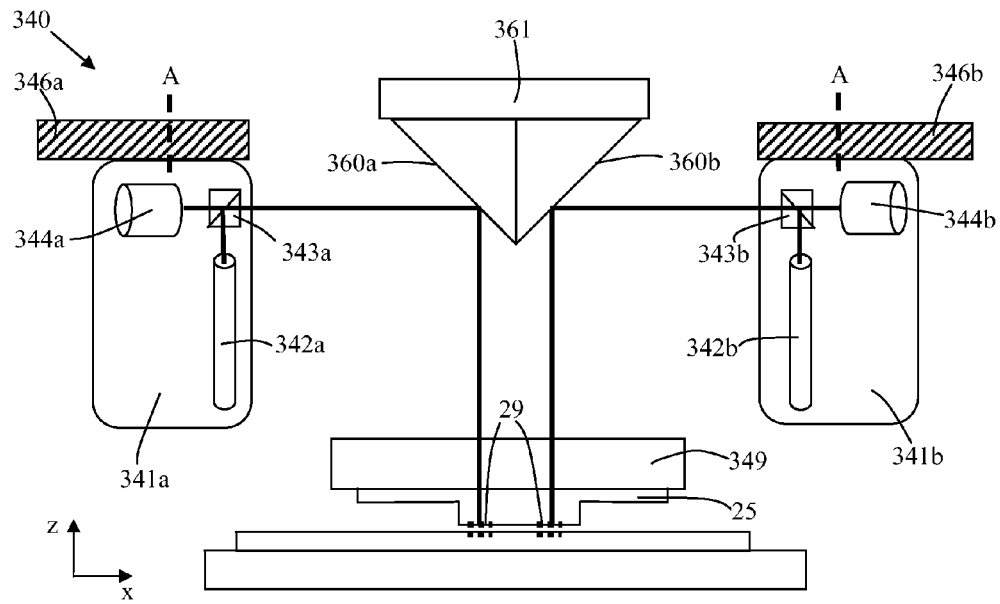

FIGS. 6*a* and 6*b* show schematically a further embodiment of the invention. An alignment apparatus 340 of an imprint lithography apparatus comprises a first alignment module 341*a* and a second alignment module 341*b*. Each alignment module comprises an alignment radiation source 342*a*, *b*, a beam splitter 343*a*, *b* and a detector 344*a*, *b*. The alignment modules 341*a*, *b* are fixed to walls 346*a*, *b* (or some other support) which form part of a structure of the imprint lithography apparatus. A pair of mirrors 360*a*, *b* is connected to an actuator 361, the pair of mirrors being located between the first and second alignment modules 341*a*, *b*. The pair of mirrors 360*a*, *b* are oriented at 45° relative to a patterned surface of an imprint template 20, 25 held by an imprint template holder 349 of the lithographic apparatus.

In use, the actuator 361 is used to move the pair of mirrors 360*a*, *b* in the z-direction, thereby providing lateral displacement of the alignment radiation beams. The pair of mirrors 360*a*, *b* is moved until the alignment radiation beams are incident upon alignment marks 24 provided on the imprint template 20. FIG. 6*b* shows the alignment apparatus 340 in a configuration which is used for an imprint template 25 having alignment marks 29 which are closer together. The actuator 361 has moved the pair of mirrors 360*a*, *b* away from the imprint template 25 (the z-direction in FIG. 6), so that the alignment radiation beams are incident upon the pair of mirrors closer to an apex where the mirrors join. The alignment radiation beams are thus closer together when they are incident upon the imprint template 25. The alignment radiation beams are incident upon the imprint template alignment marks 29.

Displacement of the alignment radiation beams in a transverse direction may be provided by rotating the alignment modules 341a, b about axes A.

The alignment modules 341a, b are rotatably mounted on the structure 346a, b, and may rotate about axes A. Rotation of the alignment modules 341a, b about the axes A allows the alignment radiation beams to be displaced laterally in a direction which is transverse to the lateral displacement provided by the pair of mirrors 360a, b. Thus, the alignment radiation beam may be displaced laterally in order to take account of the position of the imprint template alignment marks 24 in both the x and y-directions. The mirrors 360a, b may be rotatable about an axis which is parallel to the z-direction and/or perpendicular to the z-direction.

The actuator 361 may for example comprise a linear actuator, a piezo-electric actuator, an electromechanical actuator, a pneumatic actuator, or an electromagnetic actuator (e.g. a coil of the type which is found in acoustic speakers).

In a further arrangement, the alignment modules 341a, b may be moveable in the z-direction instead of or in addition to the pair of mirrors 360a, b being moveable in the z-direction. This movement of the alignment modules 341a, b may provide lateral displacement of the alignment radiation beams.

Figure 7A:
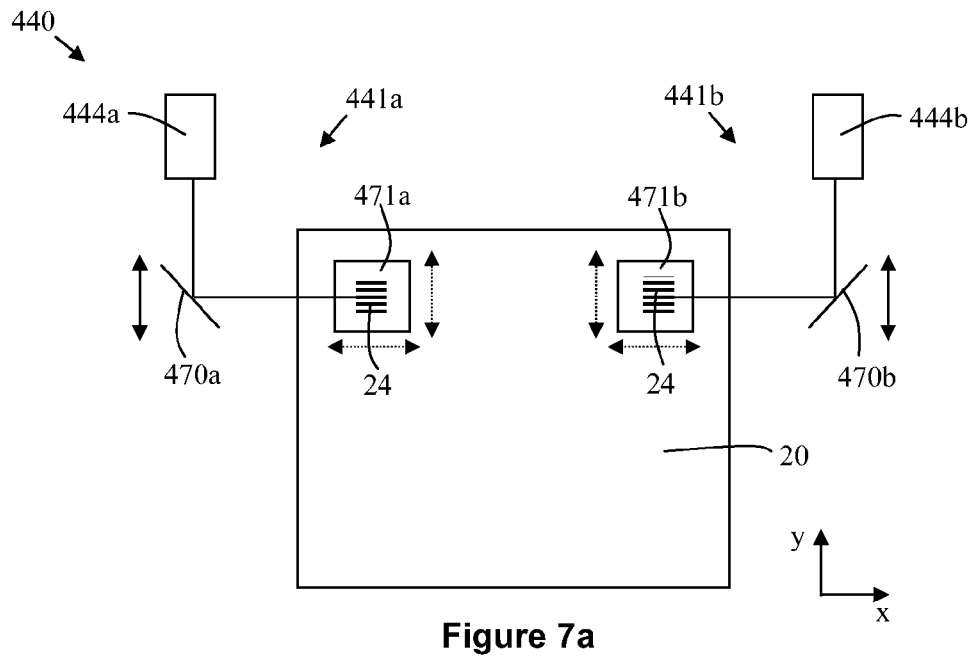
FIGS. 7a and 7b schematically depict an imprint lithography apparatus according to a further embodiment of the invention.
Figure 7B:
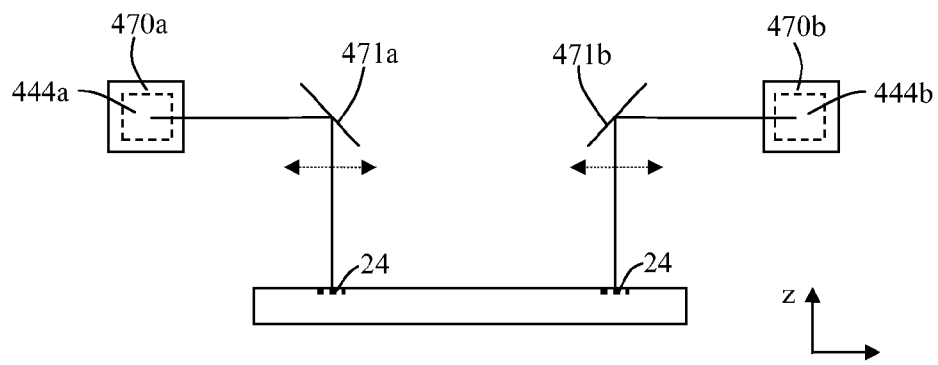

FIGS. 7a and 7b show schematically a further embodiment of the invention. An alignment apparatus 440 of an imprint lithography apparatus comprises a first alignment module 441a and second alignment module 441b. Also shown in FIG. 7 is an imprint template 20. FIG. 7a schematically shows the alignment apparatus 440 and imprint template 20 viewed from above, and FIG. 7b schematically shows the alignment apparatus and imprint template viewed from one side. Each alignment module comprises a detector 444a, b, a first moveable mirror 470a, b, and a second moveable mirror 471a, b. The first moveable mirror is moveable in the y-direction, as indicated by the double headed arrow with solid line. The second moveable mirror 471a, b is moveable in the x-direction and the y-direction as indicated by the double headed arrows having dotted lines. The detectors 444a, 444b are masked by the first moveable mirrors 470a, b in FIG. 7b, and are thus indicated by dashed lines.

The alignment modules 441a, 441b may further comprise alignment radiation beam sources (not shown) and beam splitters (not shown) which may be used to couple the alignment radiation beam to beam paths shown in FIG. 7. Actuators (not shown) may be used to move the moveable mirrors 470a, b, 471a, b.

In use, a second moveable mirror 471a, b may be moved in the x and y-directions until it lies above imprint template alignment marks 24. The first moveable mirror 470a, b is moved in the y-direction such that it maintains a beam path between the second moveable mirror 471a, b and the detector 444a, b. The moveable mirrors 470a, b, 471a, b thus allow alignment of the imprint template irrespective of the locations of the imprint template alignment marks 24.

In a further arrangement of the embodiment of FIG. 7, the first moveable mirrors 470a, b do not move in the y-direction, but instead are rotatable about an axis which extends in the z-direction. The rotation of the first moveable mirrors 470a, b may be used to direct the alignment radiation beam to the detectors 444a, b.

In a further arrangement of the embodiment of FIG. 7, the first moveable mirrors 470a, b may be fixed instead of being moveable or rotatable, and the second moveable mirrors 471a, b may be rotatable in addition to being moveable. The rotation of the second moveable mirrors 471a, b may be used to direct the alignment radiation beam to the detectors 444a, b. If necessary, the detectors 444a, b may be rotatable, in order to ensure that the alignment radiation beam has a substantially perpendicular angle of incidence at the detectors.

The mirrors 470a, b, 471a, b are examples of optical components which may be used to direct alignment radiation beams towards imprint template alignment marks 24. Other optical components may be used instead of, or in addition to, mirrors. These may include for example prisms, beam splitters and/or lenses.

Although the alignment apparatus 40, 140, 240, 340 shown in the Figures comprise two alignment modules 41a, b, 141a, b, 241a, b, 341a, b, any suitable number of alignment modules may be used. For example, referring to FIG. 2, it is common to provide an imprint template 20, 25 with four imprint template alignment marks 24, 29 which are configured to provide alignment in the y-direction, and four imprint template alignment marks (not shown) which are configured to provide alignment in the x-direction. An imprint lithography apparatus may be provided with an alignment apparatus which comprises eight alignment modules, so that each alignment module may be used to measure the alignment of an imprint template alignment mark simultaneously (with other alignment modules). The alignment of each of the alignment marks may continue to be measured during contact between the imprint template and imprintable medium provided on a substrate. This is advantageous because it may help to minimize drift of the position of the imprint template which might occur during contact of the imprint template with the imprintable medium. For example, the imprint template may expand more during illumination than the substrate, requiring magnification correction of the imprint template. The amount of required magnification correction may be determined using the alignment measurements.

In some instances more than eight alignment marks may be provided on an imprint template. For example, alignment marks may be provided halfway along each edge of the imprint template patterned region, such that sixteen alignment marks are provided rather than eight alignment marks. The imprint lithography apparatus may be provided with sixteen alignment modules, thereby allowing the alignment of each imprint template alignment mark with respect to a corresponding substrate alignment mark to be measured simultaneously. In general, a plurality of imprint template alignment modules, which may be any suitable number, may be provided. The number of imprint template alignment modules may correspond to the number of alignment marks provided on an imprint template. In an embodiment, an alignment module may be able to detect radiation from multiple alignment marks. For example, 4 alignment modules may be provided wherein each alignment module handles 2 alignment marks.

In some instances, one of the alignment modules may be fixed (i.e. not include an adjustment mechanism). For example, there may be four alignment modules, three of which include an adjustment mechanism. The imprint template and the substrate may be moved until an imprint template alignment mark and a substrate alignment mark receive an alignment radiation beam from the fixed alignment module. The adjustable imprint template modules may then be adjusted until each alignment module directs an alignment radiation beam at a different imprint template alignment mark and substrate alignment mark.

For brevity, the use of actinic radiation to cure imprintable medium provided on a substrate has not been described in relation to each of the above Figures. It will be understood however that actinic radiation may nevertheless be used in conjunction with each described embodiment. Furthermore, other mechanisms may be used to cure or otherwise solidify the imprintable medium.

Cartesian coordinates have been used above in order to aid description of some of the embodiments of the invention. The Cartesian coordinates are not intended to imply that the imprint lithography apparatus must have a particular orientation.

Above described alignment modules include an alignment radiation source 42,*a, b*, 142*a, b*, 242*a, b*, 342*a, b*. The alignment radiation sources may for example be lasers or LEDs. It is not necessary that each alignment module has its own alignment radiation source or any alignment radiation source at all. For example, a single alignment radiation source may be used to provide alignment radiation to a plurality of alignment modules by, for example, optical fiber. Alignment radiation may be directed towards an imprint template alignment mark along an optical path which does not correspond with an optical path which leads to a detector. An alignment radiation source may be used to illuminate a portion of the imprint template which includes more than one alignment mark. An alignment radiation source may be used to illuminate all of the imprint template alignment marks. The alignment radiation is not actinic, in order to avoid curing of the imprintable medium during alignment.

Above described alignment modules include a beam splitter 43*a, b*, 143*a, b*, 243*a, b* 343*a, b*. It is not necessary that the alignment modules have beam splitters. Any suitable optics may be used to direct the alignment radiation beams towards the imprint template and/or the detectors.

Above described alignment modules include a detector 44*a, b*, 144*a, b*, 244*a, b*, 344*a, b*. The detector may be a photo-diode, a plurality of photodiodes (e.g. arranged in an array), a CCD camera or the like, or some other sensor which is configured to detect the intensity of incident alignment radiation as a function of time (e.g. a temperature sensor).

Adjustment of the positions of the alignment radiation beams may be automated. For example, a controller (not shown) may be configured to receive information relating to the positions of the imprint template alignment marks, and to adjust the positions of the alignment radiation beams accordingly. The information may for example be input manually, may be input from a data source, or may be determined using detectors which detect the locations of the imprint template alignment marks.

Although the alignment marks are schematically illustrated as diffraction gratings, the alignment apparatus may be configured to detect any suitable form of alignment mark. Some alignment marks may provide alignment information in both the x and y directions simultaneously.

The illustrated embodiments may all be considered to comprise examples of alignment apparatus which comprise an adjustment mechanism that is configured to allow adjustment of locations at which alignment radiation beams provided from the alignment modules are incident upon an imprint template. Adjustment mechanisms other than those shown in the illustrated embodiments may be used.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as planarization layers or anti-reflection coating layers.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use one imprint template holder arrangement per substrate holder. In an embodiment, there is provided an apparatus configured to use more than one imprint template holder arrangement per substrate holder. Where this is the case, an alignment apparatus may be provided for each imprint template holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint template arrangement. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary. A feature of an embodiment described herein may combined into or with a feature of an other embodiment described herein as appropriate.

The invention claimed is:

1. An imprint lithography alignment apparatus comprising:
    at least two detectors which are configured to detect an imprint template alignment mark; and
    alignment radiation adjustment optics configured to provide adjustment of locations from which the at least two alignment detectors receive alignment radiation, wherein each detector is provided in an alignment module, and wherein each alignment module further comprises an alignment module actuator which is configured to move the alignment module.

2. The alignment apparatus of claim 1, wherein the alignment radiation adjustment optics comprises at least two lenses, at least one of which is connected to an actuator which is configured to move the lens.

3. The alignment apparatus of claim 1, wherein the alignment radiation adjustment optics comprises mirrors which are configured to direct the alignment radiation towards the detectors, and mirror actuators which are configured to move the mirrors.

4. The alignment apparatus of claim 3, wherein the mirror actuators are configured to move the mirrors in a direction which is substantially parallel to a patterned surface of the imprint template.

5. The alignment apparatus of claim 3, wherein the mirror actuators are configured to move the mirrors in a first direction and in a second direction perpendicular to the first direction.

6. The alignment apparatus claim 3, wherein the mirror actuators are configured to move the mirrors in a direction which is substantially perpendicular to a patterned surface of the imprint template.

7. The alignment apparatus of claim 3, wherein at least one of the mirrors is configured to rotate about an axis which is substantially perpendicular to a patterned surface of the imprint template.

8. The alignment apparatus of claim 3, wherein each detector is configured to rotate about an axis which is substantially perpendicular to a patterned surface of the imprint template.

9. The alignment apparatus of claim 3, wherein the alignment radiation adjustment optics comprises two or more mirrors and mirror actuators for each detector.

10. The alignment apparatus of claim 2, wherein the actuators comprise a linear actuator, a piezo-electric actuator, an electromechanical actuator, a pneumatic actuator, or an electromagnetic actuator.

11. The alignment apparatus of claim 1, wherein a source of alignment radiation is associated with each detector.

12. An imprint lithography apparatus comprising:
an imprint template holder configured to hold an imprint template;
a substrate table configured to support a substrate;
at least two detectors which are configured to detect an imprint template alignment mark;
alignment radiation adjustment optics configured to provide adjustment of locations from which the at least two alignment detectors receive alignment radiation; and
a control system arranged or programmed to control the adjustment of the locations from which the at least two alignment detectors receive alignment radiation based upon information received by the control system regarding the locations of the imprint template alignment marks.

13. A method of measuring alignment of an imprint template with respect to a substrate, the method comprising:
adjusting locations from which detectors receive alignment radiation from an imprint template, such that the alignment radiation beams are received from alignment marks on the imprint template, wherein the adjustment of locations from which the detectors receive alignment radiation is controlled by a controller, based upon information received by the controller regarding the locations of the imprint template alignment marks;
detecting alignment radiation from the alignment marks on the imprint template and alignment marks on the substrate; and
using the detected alignment radiation to determine a misalignment between the imprint template and the substrate.

14. The method of claim 13, wherein adjusting the locations comprises moving at least one lens of at least two lenses using an actuator.

15. The method of claim 13, wherein adjusting the locations comprises moving, using an actuator, mirrors which are configured to direct the alignment radiation towards the detectors.

16. The imprint lithography apparatus of claim 12, wherein the alignment radiation adjustment optics comprises at least two lenses, at least one of which is connected to an actuator which is configured to move the lens.

17. The imprint lithography apparatus of claim 12, wherein the alignment radiation adjustment optics comprises mirrors which are configured to direct the alignment radiation towards the detectors, and mirror actuators which are configured to move the mirrors.

18. The imprint lithography apparatus of claim 12, wherein a source of alignment radiation is associated with each detector.

19. An imprint lithography alignment apparatus comprising:
at least two detectors which are configured to detect an imprint template alignment mark; and
alignment radiation adjustment optics configured to provide adjustment of locations from which the at least two alignment detectors receive alignment radiation, wherein the alignment radiation adjustment optics comprises mirrors which are configured to direct the alignment radiation towards the detectors, and mirror actuators which are configured to move the mirrors in a direction which is substantially parallel to a patterned surface of the imprint template.

20. The imprint lithography apparatus of claim 19, wherein the alignment radiation adjustment optics comprises two or more mirrors and mirror actuators for each detector.

* * * * *